United States Patent
Reznicek et al.

(10) Patent No.: US 12,484,262 B2
(45) Date of Patent: Nov. 25, 2025

(54) TUNNEL FIELD EFFECT TRANSISTOR DEVICES

(71) Applicant: International Business Machines Corporation, Armonk, NY (US)

(72) Inventors: Alexander Reznicek, Troy, NY (US); Bahman Hekmatshoartabari, White Plains, NY (US); Ruilong Xie, Niskayuna, NY (US); ChoongHyun Lee, Chigasaki (JP)

(73) Assignee: International Business Machines Corporation, Armonk, NY (US)

( * ) Notice: Subject to any disclaimer, the term of this patent is extended or adjusted under 35 U.S.C. 154(b) by 861 days.

(21) Appl. No.: 17/528,279

(22) Filed: Nov. 17, 2021

(65) Prior Publication Data

US 2023/0155009 A1    May 18, 2023

(51) Int. Cl.
*H10D 48/00* (2025.01)
*H01L 21/02* (2006.01)
*H01L 21/225* (2006.01)
*H10D 30/01* (2025.01)
*H10D 30/67* (2025.01)
*H10D 62/10* (2025.01)
*H10D 64/01* (2025.01)

(52) U.S. Cl.
CPC ..... *H10D 48/383* (2025.01); *H01L 21/02532* (2013.01); *H01L 21/0259* (2013.01); *H01L 21/2252* (2013.01); *H10D 30/031* (2025.01); *H10D 30/6713* (2025.01); *H10D 30/6729* (2025.01); *H10D 30/6735* (2025.01); *H10D 30/6741* (2025.01); *H10D 30/6757* (2025.01); *H10D 62/118* (2025.01); *H10D 64/017* (2025.01); *H10D 64/018* (2025.01)

(58) Field of Classification Search
None
See application file for complete search history.

(56) References Cited

U.S. PATENT DOCUMENTS

| | | |
|---|---|---|
| 5,278,444 A | 1/1994 | Lieneweg |
| 6,759,904 B2 | 7/2004 | Behzad |
| 7,235,862 B2 | 6/2007 | Bulucea |
| 9,071,244 B2 | 6/2015 | Poulton |
| 9,136,061 B2 | 9/2015 | Tesson |
| 9,502,586 B1 | 11/2016 | Kim |
| 9,647,098 B2 | 5/2017 | Obradovic |
| 10,181,381 B2 | 1/2019 | Al-Hazmi |
| 10,243,002 B2 | 3/2019 | Leobandung |

(Continued)

FOREIGN PATENT DOCUMENTS

| | | |
|---|---|---|
| EP | 2693478 B1 | 5/2019 |
| KR | 101838910 B1 | 4/2018 |

OTHER PUBLICATIONS

List of IBM Patents or Patent Applications Treated as Related, filed herewith, pp. 1-2.

(Continued)

*Primary Examiner* — Bo B Jang
(74) *Attorney, Agent, or Firm* — David K. Mattheis

(57) ABSTRACT

A semiconductor tunnel FET (field effect transistor) including a plurality of nanosheet channels disposed between a first source/drain region and a second source/drain region. The first source/drain region includes a p-type material; and the second source/drain region includes an n-type material.

10 Claims, 16 Drawing Sheets

(56) References Cited

U.S. PATENT DOCUMENTS

| | | |
|---|---|---|
| 10,460,788 B2 | 10/2019 | Müller |
| 10,522,664 B2 | 12/2019 | Byun |
| 10,535,784 B2 | 1/2020 | Wright |
| 10,600,881 B2 | 3/2020 | Yang |
| 2013/0313683 A1 | 11/2013 | Gunawan |
| 2015/0364542 A1 | 12/2015 | Rodder |
| 2016/0020305 A1* | 1/2016 | Obradovic ........... H10D 48/383 438/157 |
| 2019/0067459 A1* | 2/2019 | Balakrishnan ....... H10D 30/031 |
| 2020/0411518 A1 | 12/2020 | Fulford |

OTHER PUBLICATIONS

Shim et al., "Symmetric Varactor in 130-nm CMOS for Frequency Multiplier Applications," in IEEE Electron Device Letters, vol. 32, No. 4, pp. 470-472, Apr. 2011, doi: 10.1109/LED.2011.2108994.
U.S. Appl. No. 17/528,391, filed Nov. 17, 2021.
US Patent Application Serial No. 17/528,391, filed Nov. 16, 2021.

\* cited by examiner

100

100

TUNNEL FIELD EFFECT TRANSISTOR DEVICES

BACKGROUND

The disclosure relates generally to field effect transistor (FET) devices. The disclosure relates particularly to tunnel FET devices.

Tunnel FETs operate with low power consumption, favorable for mobile and internet of things applications. Nanosheet FET devices offer promising architecture for downscaling devices below 5 nanometers.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor tunnel FET (field effect transistor) includes a plurality of nanosheet channels disposed between a first source/drain region and a second source/drain region. The first source/drain region includes a p-type material; and the second source/drain region includes an n-type material.

In one aspect, a method of fabricating a semiconductor device includes forming a stack of nanosheet channels upon a substrate, forming a dummy gate structure adjacent to the nanosheet channels, forming a p-type source/drain region adjacent to one side of the dummy gate structure, and forming an n-type source/drain region adjacent to an opposing side of the dummy gate structure.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
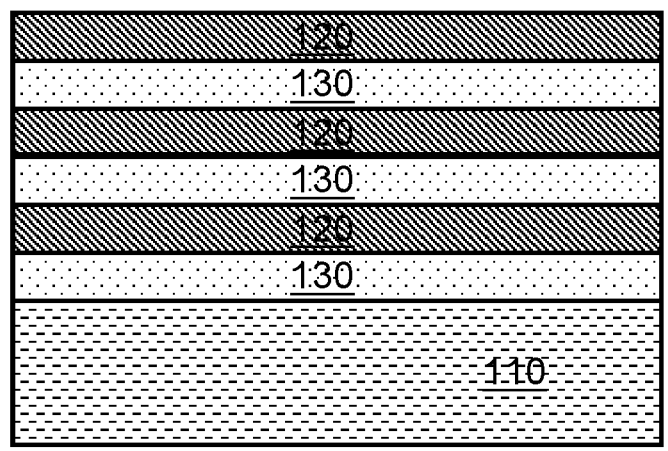
FIG. 1 provides a cross-sectional view of a step in the fabrication of a semiconductor device, according to an embodiment of the invention. The figure illustrates a formed stack of semiconductor nanosheets upon an underlying substrate.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Disclosed embodiments provide structures and associated fabrication methods yielding nanosheet tunnel FET's (TFET) by epitaxially forming a n-type source region on one side of the device channel, and epitaxially forming a p-type drain region on the other side of the channel. In an embodiment, the n-type source region overlaps with the device channel, enhancing the modulation of the band-to-band tunneling under the influence of the applied gate electric field. Creation of this source overlap includes the controlled diffusion of source epitaxy dopants into the nanosheet channel. Short duration annealing, such as through nano or microsecond laser pulses, rapid thermal annealing, or flash lamp annealing, applied to the device, create well defined overlap doping profiles in the nanosheet channels. The overlap region yields high TFET performance. Annealing occurs prior to epitaxial growth of the p-type drain region preventing diffusion of p-type dopants into the nanosheet channels.

Reference is now made to the figures. The figures provide schematic cross-sectional illustration of semiconductor devices at intermediate stages of fabrication, according to one or more embodiments of the invention. The figures provide a cross-section view of the device during the illustrated stages of fabrication. The figures provide schematic representations of the devices of the invention and are not to be considered accurate or limiting with regards to device element scale.

FIG. 1 provides a cross-sectional view of a device 100 according to an embodiment of the invention at a first intermediate stage of fabrication. For the purpose of clarity, several fabrication steps leading up to the production of the semiconductor structure as illustrated in FIG. 1 are omitted. In other words, the semiconductor structure does not necessarily start out in the form illustrated in FIG. 1, but may develop into the illustrated structure over one or more well-known processing steps which are not illustrated but are well-known to those of ordinary skill in the art. As shown in the Figure, alternating nanosheets of a sacrificial compound semiconductor material 130 and elemental semiconductor material 120 are disposed upon an underlying semiconductor substrate 110 and an optional buffer layer (not shown).

The semiconductor substrate 110 may include any semiconductor material including, for example, silicon. The term "semiconductor material" is used throughout the present application to denote a material that has semiconducting properties. Besides silicon, the semiconductor material may be, carbon doped silicon (Si:C), germanium (Ge), silicon germanium (SiGe), carbon doped silicon-germanium (SiGe:C), Si alloys, Ge alloys, III-V semiconductor materials (e.g., gallium arsenide (GaAs), indium gallium arsenide (InGaAs), indium phosphide (InP), or), II-VI materials (e.g., cadmium selenide (CdSe), cadmium sulfide (CdS), cadmium telluride (CdTe), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements. In one embodiment, the optional buffer is comprised of a III-V compound (e.g., alloy). For example, optional buffer may be comprised of gallium arsenide phosphide ($GaAs_{1-x}P_x$). However, the optional buffer may be comprised of any material suitable for use in accordance with the embodiments described herein.

In an embodiment, the nanosheet stack is comprised of alternating nanosheet layers. For example, as shown in FIG. 1, the nanosheet stack comprises three first nanosheet layers 120 comprising a first material and three second nanosheet layers 130 comprising another material. Other combinations comprising more or fewer layers 120 and 130 may be formed. In general, the nanosheet stack structure comprises second nanosheet layers 130 disposed between adjacent first nanosheet layers 120. Each nanosheet layer of nanosheet stack may have a thickness ranging from about 3 nm to about 10 nm, although thinner or thicker nanosheets are also possible.

The nanosheet stack can be formed by epitaxially growing the nanosheet stack with the second nanosheet layers 130 between adjacent first nanosheet layers 120. In one embodiment, first nanosheet layers 120 are comprised of silicon. In an embodiment, nanosheet layers 120 comprise silicon lightly doped with a p-type dopant, such as boron, at a concentration ranging from between about $5 \times 10^{17}/cm^3$, to about $1 \times 10^{19}/cm^3$. In another embodiment, second nanosheet layers 130 can be comprised of $Si_xGe_y$, where x and y represent relative atomic concentration of silicon (Si) and germanium (Ge), respectively. X and y are less than 1 and their sum is equal to 1. In some embodiments, x is equal to 0.75 and y is equal to 0.25.

Figure 2:
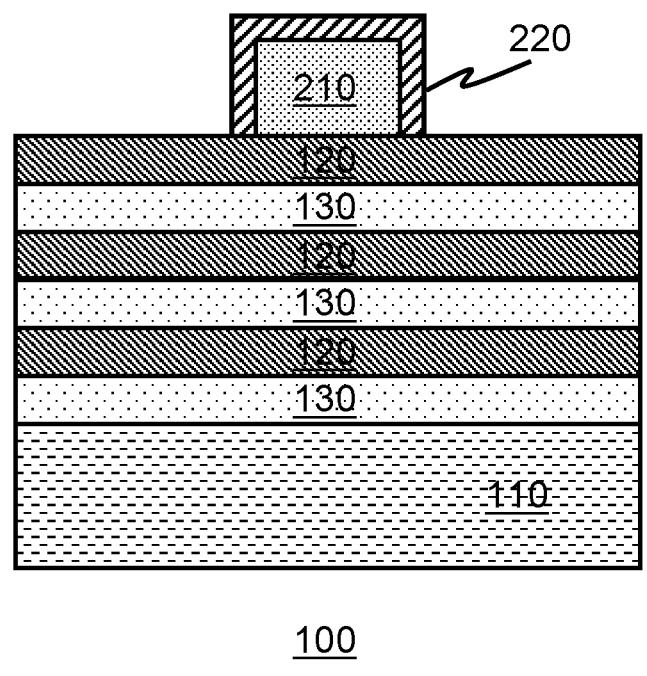
FIG. 2 provides a cross-sectional view of a step in the fabrication of a semiconductor device, according to an embodiment of the invention. The figure illustrates a dummy gate structure formed above the stacked nanosheets.

FIG. 2 illustrates the device 100 at a third intermediate stage of fabrication. As shown in the figure, a dummy gate structure including dummy gate material 210, and protective material 220 has been formed above the nanosheet stack. In some embodiments, the dummy gate includes a dummy gate dielectric (e.g., silicon oxide) and a dummy gate placeholder (e.g., amorphous or polycrystalline silicon). The dummy gate may further comprise a hardmask layer (e.g., silicon nitride) (not shown) at the top. After depositing the dummy gate stack, it is patterned (e.g., by RIE). The protective material 220 may comprise any suitable dielectric material(s), for example, SiOCN. The protective material 220 can be formed by deposition followed by RIE. In some embodiments, the lateral width of each spacer is about 6 nm.

Figure 3:
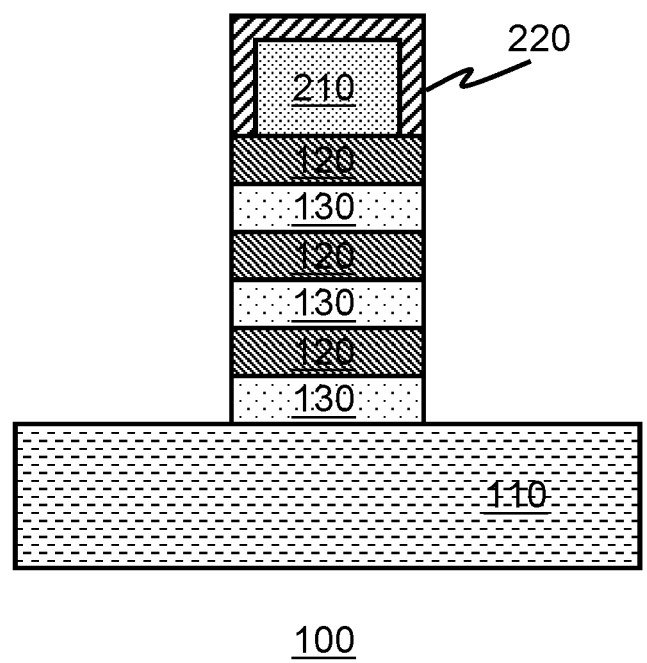
FIG. 3 provides a cross-sectional view of a step in the fabrication of a semiconductor device, according to an embodiment of the invention. The figure illustrates the device after the recessing of nanosheets, forming source/drain spaces.

FIG. 3 illustrates device 100 at a fourth intermediate stage of fabrication. As shown in the Figure, nanosheets 120 and 130 have been selectively etched back to a cross-section matching that of the dummy gate 210 and protective sidewall spacers 220 using an etching method such as RIE.

Figure 4:
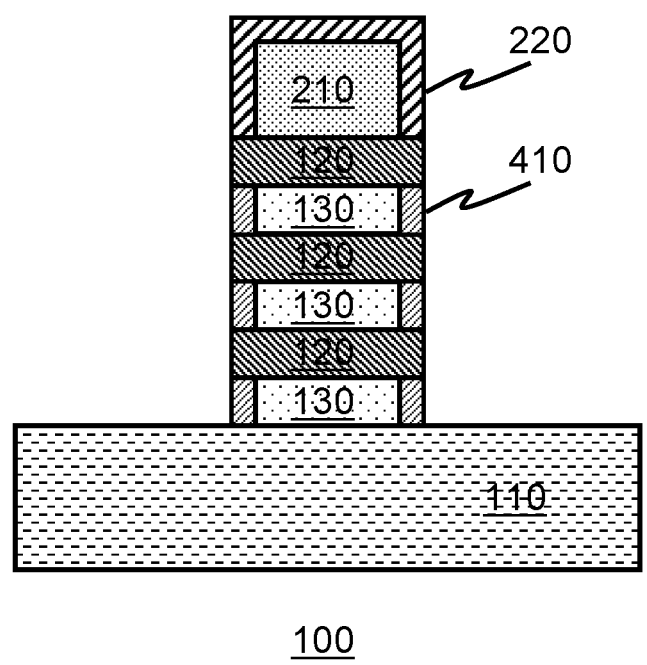
FIG. 4 provides a cross-sectional view, of a step in the fabrication of a semiconductor device, according to an embodiment of the invention. The figure illustrates the device after the formation of inner spacers between otherwise adjacent nanosheets.

FIG. 4 illustrates device 100 following the selective masking and etching of nanosheets adjacent to the dummy gate structures, and the formation of inner spacers between adjacent nanosheet channel layers 120, yielding individual gate structures. Selective anisotropic etching such as RIE removes portions of the alternating sacrificial layers 130 and channel layers 120 adjacent to dummy gate structures. Protective gate sidewall spacers 220 prevent damage to the dummy gate structures and isolate the gate stack from the source/drain material to prevent electrical short circuits. The nanosheet layer portions are removed to the upper surface of the substrate 110.

FIG. 4 further illustrates device 100 following formation of inner spacers between nanosheets of the respective tunnel FET devices. Portions of nanosheet stack layers 130, which are not underneath gate sidewall spacers 220 and not underneath dummy gate 210 are removed. Etching generally refers to the removal of material from a substrate (or structures formed on the substrate) and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching.

After generally etching the nanosheet stack, a selective etching of SiGe layers 130 of the nanosheet stack removes portions of the layers which are underneath gate sidewall spacers 220. Inner spacers 410 are then formed in etched portions and thus are located under gate sidewall spacers 220. Inner spacers 410 can be composed of any suitable dielectric material, for example $Si_3N_4$, SiBCN, SiNC, SiN, SiCO, $SiO_2$, SiNOC, etc. The inner spacer 410 is formed by a conformal dielectric liner deposition followed by isotropic etching back, so dielectric liner is removed everywhere except the regions pinched-off in those under spacer cavities.

Figure 5:
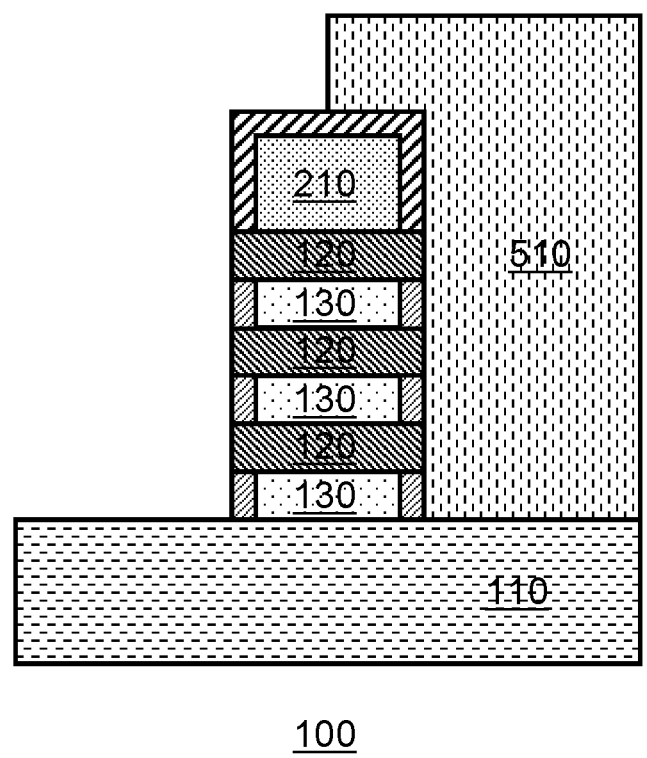
FIG. 5 provides a cross-sectional view of a step in the fabrication of a semiconductor device, according to an embodiment of the invention. The figure illustrates the device after the masking of one side of the dummy gate structure.

FIG. 5 illustrates device 100 following formation of a protective mask layer, such as an organic planarization layer (OPL), shielding one side of the dummy gate and nanosheet channel structure.

Figure 6:
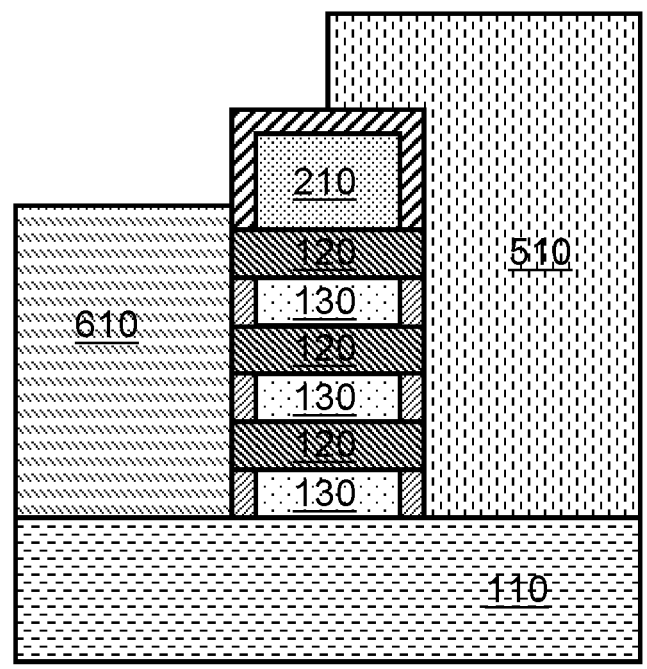
FIG. 6 provides a cross-sectional view of a step in the fabrication of a semiconductor device, according to an embodiment of the invention. The figure illustrates the device after the epitaxial growth of an-type source drain region on the unmasked side of the dummy gate.

FIG. 6 illustrates device 100 following epitaxial growth of an n-type source region from the exposed edges of the nanosheet layers 120. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 610 may be doped in situ by adding one or more dopant species to the epitaxial material. The dopant used will depend on the type of FET being formed, whether p-type or n-type. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. Exemplary n-type materials include Si:P, Si:As, Si:Sb. In an embodiment, source region dopant concentration levels range from between about $1\times10^{20}/cm^3$ to about $1\times10^{21}/cm^3$.

Figure 7:
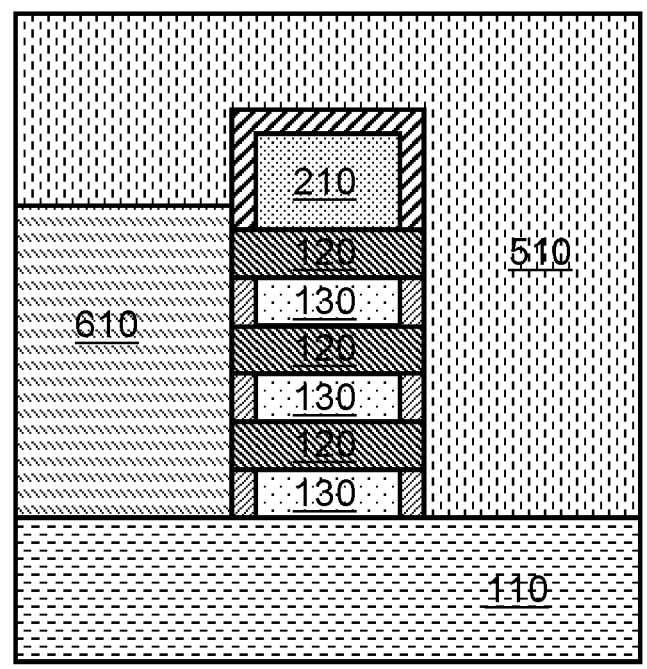
FIG. 7 provides a cross-sectional view of a step in the fabrication of a semiconductor device, according to an embodiment of the invention. The figure illustrates the device after the encapsulation of the/drain region.

FIG. 7 illustrates device 100 following encapsulation of the p-type source region with additional masking material such as SiN. Chemical mechanical planarization of the material follows deposition of the masking material.

Figure 8:
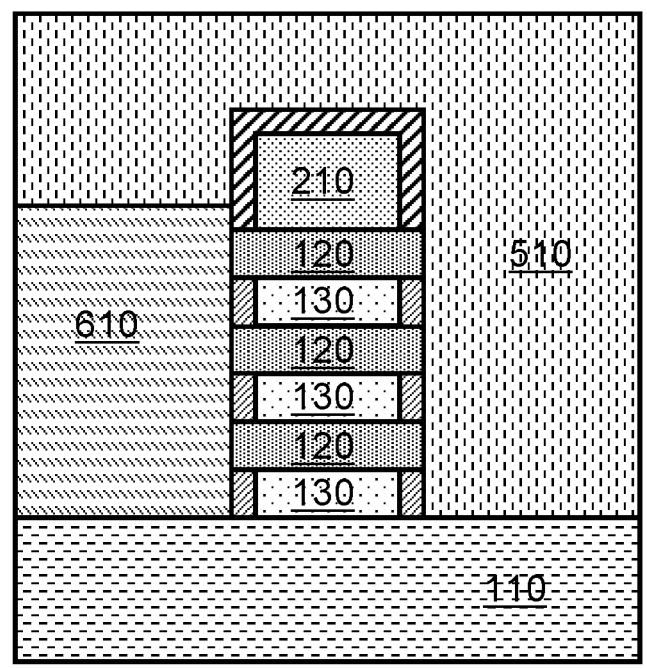
FIG. 8 provides a cross-sectional view of a step in the fabrication of a semiconductor device, according to an embodiment of the invention. The figure illustrates the device after annealing the n-type source/drain region and nanosheet channels.

FIG. 8 illustrates device 100 following annealing of the n-type source region and the nanosheet channels. Exemplary annealing methods include nanosecond or microsecond laser pulses, rapid thermal annealing and flash lamp annealing. The heating associated with the annealing process drives a controlled diffusion of n-type dopants from the source region 610 into the nanosheet channels 120, yielding a modified dopant concentration profile across the width of the nanosheet channels. The dopant profile ranges from a relatively high dopant concentration adjacent to the n-type source region and relatively low or zero near the opposite end of the nanosheet channel.

Figure 9:
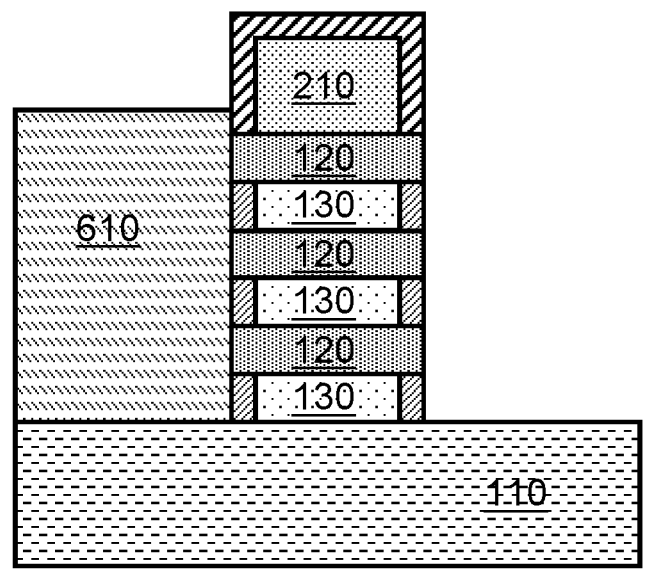
FIG. 9 provides a cross-sectional view of a step in the fabrication of a semiconductor device, according to an embodiment of the invention. The figure illustrates the device after the removal of the masking material.

FIG. 9 illustrates device 100 following removal of the masking material.

Figure 10:
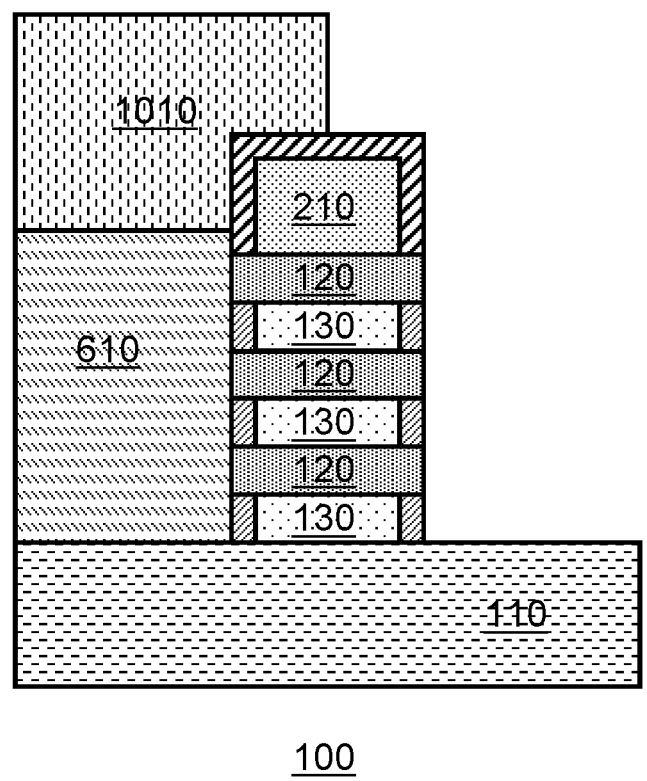
FIG. 10 provides a cross-sectional view of a step in the fabrication of a semiconductor device, according to an embodiment of the invention. The figure illustrates the device after the masking of the n-type source drain region and one side of the dummy gate structure.

FIG. 10 illustrates device 100 following partial masking of the n-type source region and the associated side of the dummy gate with a masking material 1010, such as a nitride.

Figure 11:
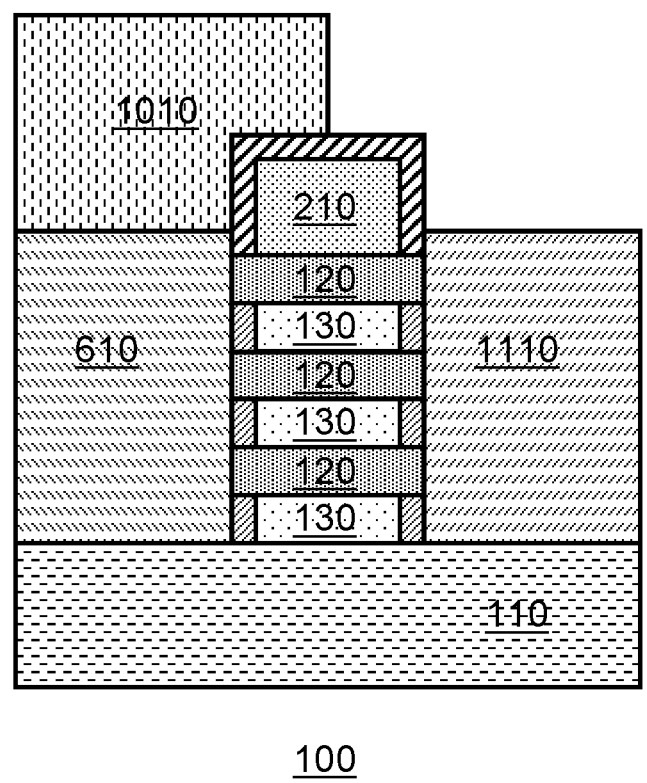
FIG. 11 provides a cross-sectional view of a step in the fabrication of a semiconductor device, according to an embodiment of the invention. The figure illustrates the device after the epitaxial growth of a p-type source/drain region on one side of the dummy gate structure.

FIG. 11 illustrates device 100 following epitaxial growth of the p-type drain region 1110 adjacent to the edges of the nanosheet channels 120, in a similar manner as that described above for p-type source 610. As used herein, "p-type" refers to the addition of impurities to an intrinsic semiconductor that creates deficiencies of valence electrons. In a silicon-containing semiconductor, examples of p-type dopants, i.e., impurities, include but are not limited to boron, aluminum, gallium and indium. Exemplary p-type source materials include SiGe:B, SiGe:Ga, etc. In an embodiment, drain dopant concentrations range from between about $1\times10^{19}/cm^3$ to about $1\times10^{2}/cm^3$.

Figure 12:
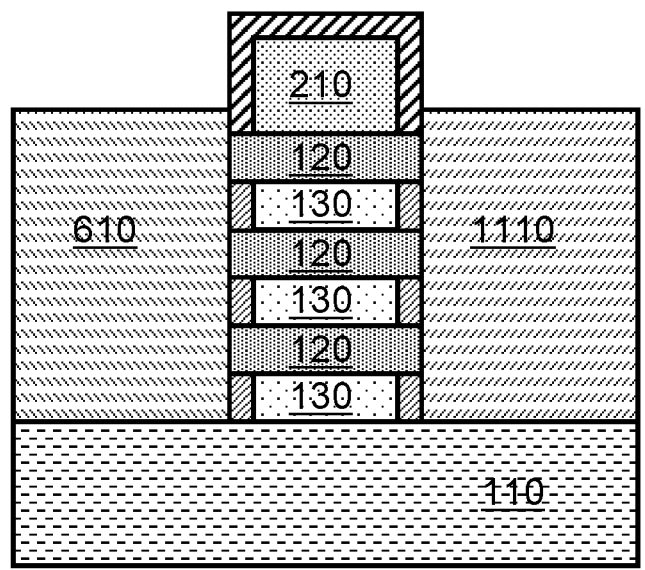
FIG. 12 provides a cross-sectional view of a step in the fabrication of a semiconductor device, according to an embodiment of the invention. The figure illustrates the device after the removal of the masking material.

FIG. 12 illustrates device 100 following the removal of mask 1010 from the device.

Figure 13:
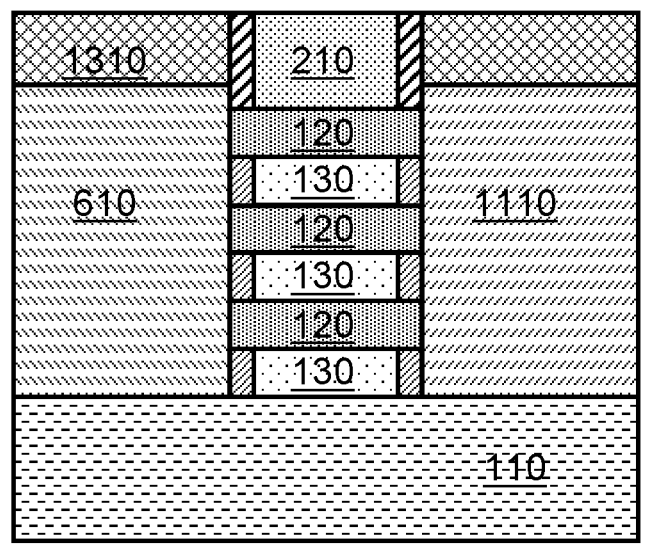
FIG. 13 provides a cross-sectional view of a step in the fabrication of a semiconductor device, according to an embodiment of the invention. The figure illustrates the device after the deposition of interlayer dielectric materials.

FIG. 13 illustrates device 100 following deposition of interlayer dielectric material 1310, such as flowable silicon dioxide, to encapsulate the source/drain regions and the dummy gate stack.

Figure 14:
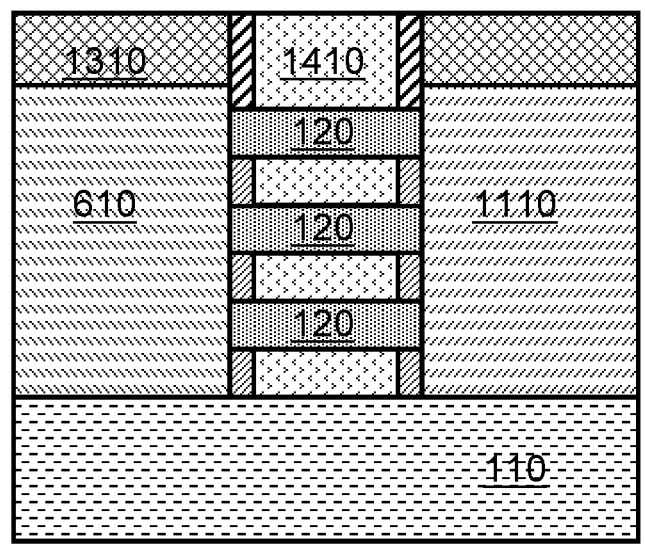
FIG. 14 provides a cross-sectional view of a step in the fabrication of a semiconductor device, according to an embodiment of the invention. The figure illustrates the device after replacing the dummy gate with an HKMG structure.

FIG. 14 illustrates device 100 following the removal of dummy gate 210, sacrificial SiGe 130, and formation of the high-k metal gate (HKMG) stack 1410. As shown in the Figure, a replacement metal gate structure has been formed in the void space created by removal of the dummy gate 210, and sacrificial SiGe 130. Gate structure 1410 includes gate dielectric and gate metal layers (not shown). The gate dielectric is generally a thin film and can be silicon oxide, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. Gate dielectric can be deposited by CVD, ALD, or any other suitable technique. Metal gate can include any known metal gate material known to one skilled in the art, e.g., TiN, TiAl, TiC, TiAlC, tantalum (Ta) and tantalum nitride (TaN), W, Ru, Co, Al. Metal gates may be formed via known deposition techniques, such as atomic layer deposition, chemical vapor deposition, or physical vapor deposition. It should be appreciated that a chemical mechanical planarization (CMP) process can be applied to the top surface. In an embodiment, the replacement metal gate includes work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). After formation and CMP of the HKMG, the HKMG can be optionally recessed followed by a deposition and CMP of a gate cap dielectric material (not shown), such as SiN, or similar materials, completing the replacement metal gate fabrication stage for the device.

Figure 15:
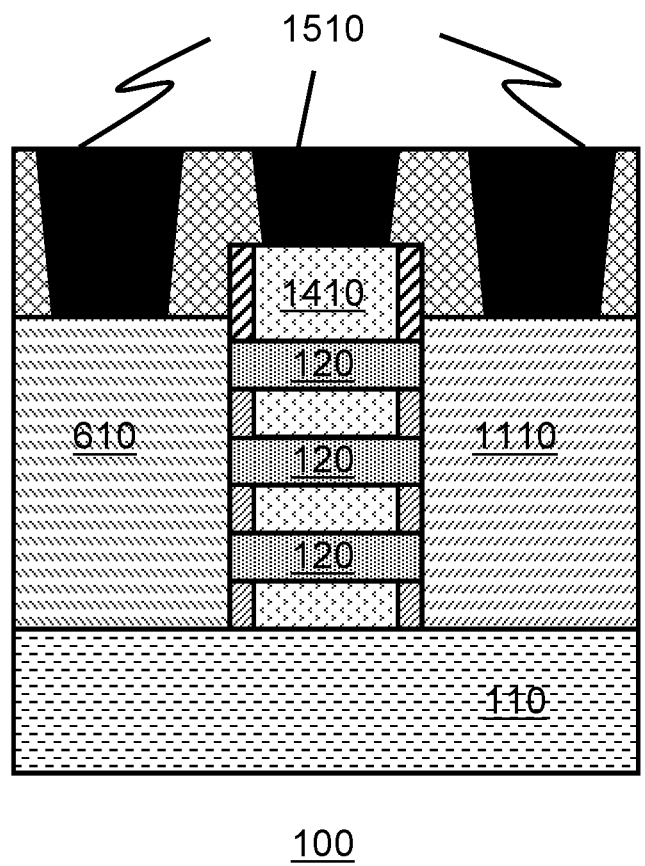
FIG. 15 provides a cross-sectional view of a step in the fabrication of a semiconductor device, according to an embodiment of the invention. The figure illustrates the device after the formation of device contacts.

FIG. 15 illustrates device 100 following formation of upper device contacts 1510. A trench metal contact process yields a metallized layer adjacent to and above the S-D region 610, and 1110, and gate sidewall spacers 220. In an embodiment, formation of the trench metal layer 1010 includes forming a silicide layer between contact and epitaxial grown S/D regions 610, and 1110 (e.g., Ni silicide, Ti silicide, NiPt silicide, Co silicide, etc.) followed by forming metallization materials above the silicide (e.g., a thin adhesion metal such as TiN and a bulk metal fill such as Co, W, etc., followed by CMP.

Figure 16:
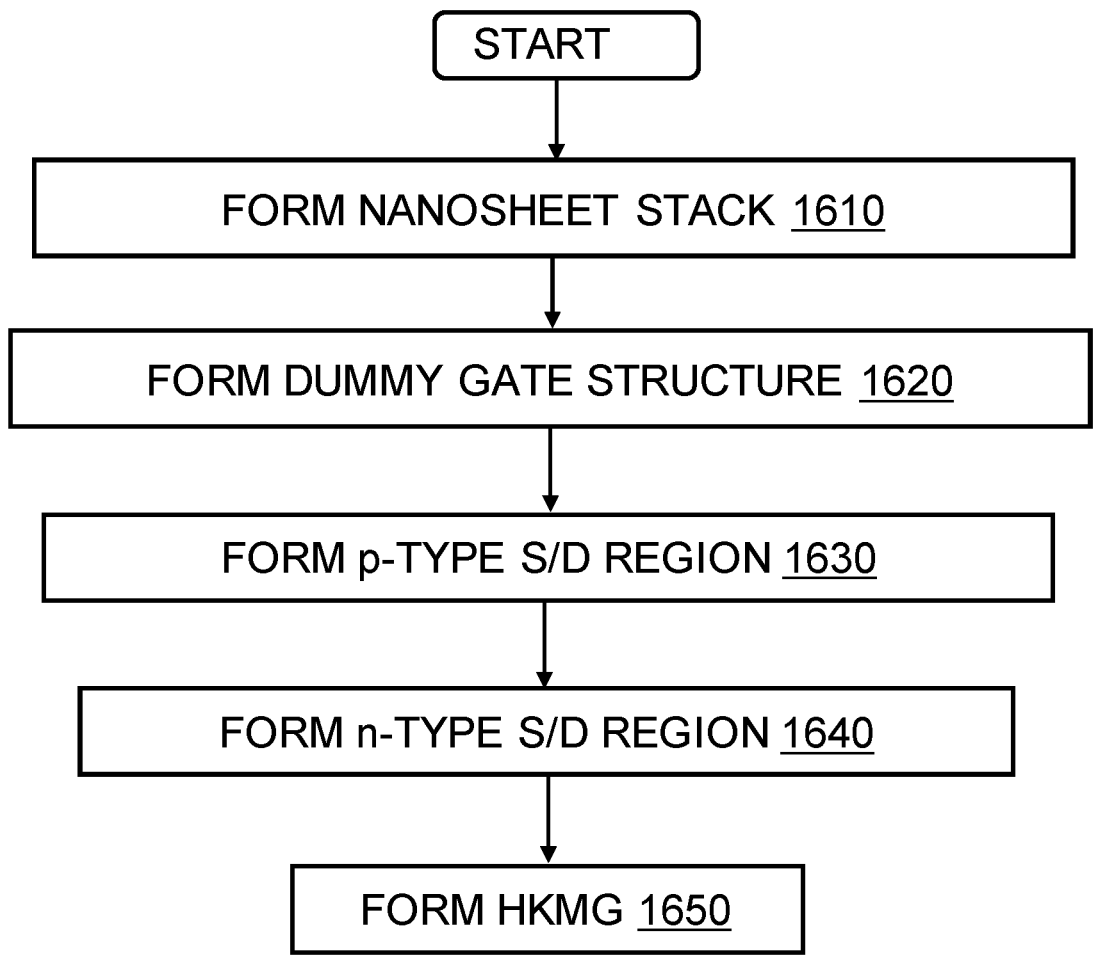
FIG. 16 provides a flowchart depicting operational steps for forming semiconductor device, according to an embodiment of the invention.

Flowchart 1600, of FIG. 16, lists operational steps associated with the fabrication of a semiconductor device, according to an embodiment of the invention. At block 1610, a stack of alternating semiconductor nanosheet layers are epitaxially grown upon an underlying substrate. The layers alternate between a sacrificial semiconductor material, such as a SiGe material, and semiconductor channel materials, such as Si.

At block 1620, the method forms one or more dummy gate structures upon the stack of nanosheet layers. The dummy gate comprises placeholder materials sized to the desired dimensions of the eventual high-k metal gate structure.

At block 1630, the method masks one side of the dummy gate and nanosheet stack and epitaxially grows an n-type source region adjacent to the edges of the channel nanosheets. As an optional step, after masking the intermediate device, an annealing process drives a controlled diffusion of n-type dopants from the n-type source region into the semiconductor channel nanosheets, improving the performance of the tunnel FET device.

At block 1640, the method grows an p-type drain region adjacent to the edges of the channel nanosheets on the side of the dummy gate and nanosheets opposite to the n-type source region. The n-type source and the associated side of the dummy gate are masked and the drain region is epitaxially grown from the edges of the channel nanosheets.

At block 1650, fabrication of the device proceeds with the replacement of the dummy gate by a high-k metal gate structure. Additional fabrication steps associated with the formation of gate and S/D contacts follows as well.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor nanosheet tunnel FET (field effect transistor) comprising
a plurality of nanosheet channels disposed between a first source/drain region and a second source/drain region;
wherein the first source/drain region comprises a p-type material;
wherein the second source/drain region comprises an n-type material; and
wherein the nanosheet channels adjacent to the n-type material comprise n-type dopants.

2. The nanosheet tunnel FET according to claim 1 further comprising inner spacers disposed between otherwise adjacent nanosheet channels.

3. The nanosheet tunnel FET according to claim 1, further comprising independent first source/drain and second source/drain electrical contacts.

4. The nanosheet tunnel FET according to claim 1 wherein the p-type material comprises a SiGe:B doped material.

5. The nanosheet tunnel FET according to claim 1 wherein the n-type material comprises a Si:P doped material.

6. The nanosheet tunnel FET according to claim 1 further comprising a high-k metal gate structure around the nanosheet channels.

7. The nanosheet FET according to claim 1, wherein the nanosheet channels comprise a p-type dopant.

8. The nanosheet FET according to claim 1, wherein a nanosheet channel portion of the plurality of nanosheet channels adjacent to the first source/drain region comprise a p-type dopant and a nanosheet channel portion of the plurality of nanosheet channels adjacent to the second source/drain region comprises an n-type dopant.

9. The nanosheet FET according to claim 1, wherein the first source/drain region comprises a p-type dopant concentration between about $1 \times 10^{19}$/cm3 to about $1 \times 10^2$/cm3.

10. The nanosheet FET according to claim 1, wherein the second source/drain region comprises n n-type dopant concentration between about $1 \times 10^{20}$/cm3 to about $1 \times 10^{21}$/cm3.

* * * * *